United States Patent
Tanaka et al.

(10) Patent No.: US 7,246,432 B2
(45) Date of Patent: Jul. 24, 2007

(54) METHOD OF MANUFACTURING SEMICONDUCTOR DEVICE

(75) Inventors: Shuichi Tanaka, Chino (JP); Haruki Ito, Chino (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/446,731

(22) Filed: Jun. 5, 2006

(65) Prior Publication Data

US 2006/0288572 A1 Dec. 28, 2006

(30) Foreign Application Priority Data

Jun. 28, 2005 (JP) ............................. 2005-188279

(51) Int. Cl.
  *H01L 21/60* (2006.01)
  *H01L 23/48* (2006.01)
(52) U.S. Cl. ..................... 29/846; 29/874; 29/885; 257/738; 438/613
(58) Field of Classification Search .............. 29/825, 29/829, 846, 847, 848, 849, 850, 851, 874, 29/885; 257/738, 737, 778, 786; 438/613, 438/614, 702
See application file for complete search history.

(56) References Cited

U.S. PATENT DOCUMENTS

| | | | | |
|---|---|---|---|---|
| 6,624,504 B1 * | 9/2003 | Inoue et al. | .................. | 257/668 |
| 7,098,127 B2 * | 8/2006 | Ito | .............................. | 438/614 |
| 2002/0130412 A1 * | 9/2002 | Nagai et al. | ................. | 257/737 |
| 2005/0236104 A1 | 10/2005 | Tanaka | | |
| 2005/0275115 A1 | 12/2005 | Tanaka et al. | | |

FOREIGN PATENT DOCUMENTS

| | | |
|---|---|---|
| JP | 02-272737 | 11/1990 |
| JP | 2005-101527 | 4/2005 |
| JP | 2005-109110 | 4/2005 |
| JP | 2005-136402 | 5/2005 |
| JP | 2005-310815 | 11/2005 |
| JP | 2005-340761 | 12/2005 |
| JP | 2005-353983 | 12/2005 |

* cited by examiner

*Primary Examiner*—A. Dexter Tugbang
*Assistant Examiner*—Livius R. Cazan
(74) *Attorney, Agent, or Firm*—Harness, Dickey & Pierce, P.L.C.

(57) ABSTRACT

A method of manufacturing a semiconductor device includes (a) forming a first resin layer on a semiconductor substrate including an electrode pad and a passivation film, (b) curing the first resin layer, (c) forming a second resin layer which slopes more gently than the cured first resin layer on at least a lower portion of the first resin layer, (d) curing the second resin layer to form a resin protrusion including the first and second resin layers, and (e) forming a conductive layer which is electrically connected with the electrode pad and passes over the resin protrusion.

6 Claims, 6 Drawing Sheets

US 7,246,432 B2

METHOD OF MANUFACTURING SEMICONDUCTOR DEVICE

Japanese Patent Application No. 2005-188279, filed on Jun. 28, 2005, is hereby incorporated by reference in its entirety.

BACKGROUND OF THE INVENTION

The present invention relates to a method of manufacturing a semiconductor device.

A semiconductor device has been developed in which a resin core bump formed by forming a conductive layer on a resin protrusion is used as an external terminal in order to increase electrical connection reliability (see JP-A-2-272737). In this semiconductor device, a resin protrusion is formed on a semiconductor substrate, and a conductive layer is then formed to extend from an electrode pad to the resin protrusion. In the step of forming the conductive layer, argon (Ar) reverse sputtering is generally performed in order to remove an oxide layer on the electrode pad. However, Ar reverse sputtering causes the surface of the resin protrusion to be carbonized. This may decrease the insulation resistance of the resin, whereby migration may occur. In the above-mentioned structure, since the conductive layer is formed to pass over the resin protrusion having a three-dimensional shape, it is necessary to prevent separation or breakage of the conductive layer.

SUMMARY

According to one aspect of the invention, there is provided a method of manufacturing a semiconductor device comprising:
(a) forming a first resin layer above a semiconductor substrate including an electrode pad and a passivation film;
(b) curing the first resin layer;
(c) forming a second resin layer on at least a lower portion of the first resin layer;
(d) curing the second resin layer to form a resin protrusion which includes the first and second resin layers and slopes more gently than the cured first resin layer; and
(e) forming a conductive layer which is electrically connected to the electrode pad and passes over the resin protrusion.

DETAILED DESCRIPTION OF THE EMBODIMENT

Figure 1:
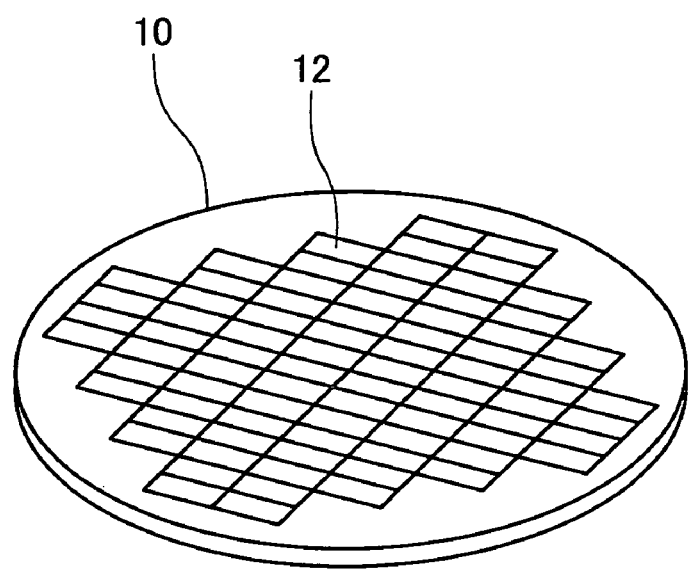
FIG. 1 is a view illustrative of a method of manufacturing a semiconductor device according to one embodiment of the invention.

The invention may increase the adhesion of a conductive layer and prevent migration.

(1) According to one embodiment of the invention, there is provided a method of manufacturing a semiconductor device comprising:
(a) forming a first resin layer above a semiconductor substrate including an electrode pad and a passivation film;
(b) curing the first resin layer;
(c) forming a second resin layer on at least a lower portion of the first resin layer;
(d) curing the second resin layer to form a resin protrusion which includes the first and second resin layers and slopes more gently than the cured first resin layer; and
(e) forming a conductive layer which is electrically connected to the electrode pad and passes over the resin protrusion.

According to this embodiment, since the slope of the resin protrusion can be reduced by forming the second resin layer, separation and breakage of the conductive layer can be prevented, and the adhesion of the conductive layer can be increased.

In this embodiment, when a component B is formed on (or above) a specific component A, the component B may be directly formed on the component A, or another component may be interposed between the component B and the component A. This also applies to the following description.

(2) In this method of manufacturing a semiconductor device, in the step (e), an oxide film may be removed from a surface of the electrode pad and a surface of the resin protrusion may be carbonized by using argon (Ar) gas before forming the conductive layer, and, after forming the conductive layer, the resin protrusion may be partially removed by using the conductive layer as a mask.

Even if the resin protrusion is carbonized by the Ar gas to form a carbide layer (or plasma polymerized layer), since the resin protrusion is formed to gently slope, the resin protrusion can be easily removed without causing the carbide layer or the like to remain. In particular, the carbide layer or the like tends to remain on the lower portion of the resin protrusion, but the carbide layer or the like remaining on the lower portion of the resin protrusion can be easily removed according to this embodiment.

(3) In this method of manufacturing a semiconductor device, a resin material for the second resin layer before curing may exhibit wettability with the passivation film greater than the wettability of a resin material for the first resin layer before curing.

This allows the resin protrusion to be easily formed to gently slope.

(4) In this method of manufacturing a semiconductor device, in the step (c), the second resin layer may be formed over an entire periphery of the first resin layer.

(5) In this method of manufacturing a semiconductor device, in the step (c), the second resin layer may be formed on at least the lower portion of the first resin layer by applying a resin material for the second resin layer to the semiconductor substrate and etching the applied resin material.

(6) In this method of manufacturing a semiconductor device, in the step (c), the second resin layer may be formed by a droplet discharge method.

Method of Manufacturing Semiconductor Device

FIGS. 1 to 13 are views illustrative of a method of manufacturing a semiconductor device according to one embodiment of the invention.

Figure 2:
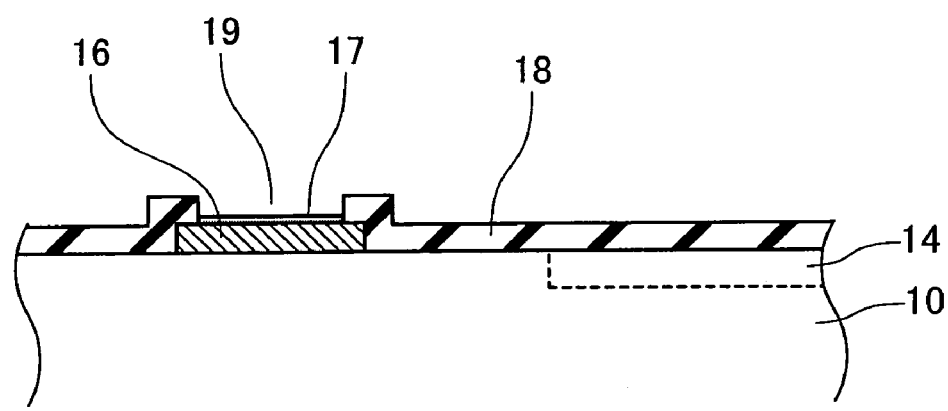
FIG. 2 is a view illustrative of a method of manufacturing a semiconductor device according to one embodiment of the invention.

(1) As shown in FIGS. 1 and 2, a semiconductor substrate 10 is provided. The semiconductor substrate 10 is a semiconductor wafer (see FIG. 1), for example. In this case, the semiconductor substrate 10 includes a plurality of chip areas 12 in which semiconductor chips are respectively formed, and an integrated circuit 14 is formed in each chip area 12. Specifically, when dividing the semiconductor substrate 10 into semiconductor chips, each semiconductor chip includes the integrated circuit 14. The integrated circuit 14 includes at least an active element such as a transistor. The chip area 12 has a quadrilateral (e.g. rectangular) shape when viewed from the top side, for example. Electrode pads (e.g. aluminum pads) 16 are formed in each chip area 12. The electrode pads 16 may be arranged along two opposing sides (e.g. two long sides) or four sides of the chip area 12. In this case, one or more rows of electrode pads 16 are arranged on each side. When the electrode pads 16 are arranged near the edge of the chip area 12, the integrated circuit 14 may be formed at the center of the chip area 12 enclosed by the electrode pads 16. The electrode pad 16 may be formed in the area in which the electrode pad 16 overlaps the integrated circuit 14 when viewed from the top side. The electrode pad 16 is electrically connected with the integrated circuit 14 through an internal interconnect (not shown).

A passivation film (protective film) 18 is formed on the surface (surface on which the integrated circuit 14 is formed) of the semiconductor substrate 10. The passivation film 18 may be formed using an inorganic or organic material. For example, the passivation film 18 may include at least one of a silicon oxide film and a silicon nitride film. An opening 19 which exposes the electrode pad 16 is formed in the passivation film 18. The opening 19 exposes at least part (e.g. only the center) of the electrode pad 16. An oxide layer 17 is generally formed on the electrode pad 16. The oxide layer 17 is formed by spontaneous oxidation or the like, and covers the surface of the electrode pad 16.

(2) As shown in FIGS. 3 to 6, a first resin layer 20 is formed.

The first resin layer 20 may be formed on the semiconductor substrate 10 (on the passivation film 18 in more detail) in the area differing from the electrode pad 16 when viewed from the top side. The formation area of the first resin layer 20 is not limited. For example, the first resin layer 20 may be linearly formed to have a specific width. In this case, the first resin layer 20 may be formed to extend along (e.g. in parallel to) the boundary (e.g. the long side) of the chip area 12 of the semiconductor substrate 10.

Figure 3:
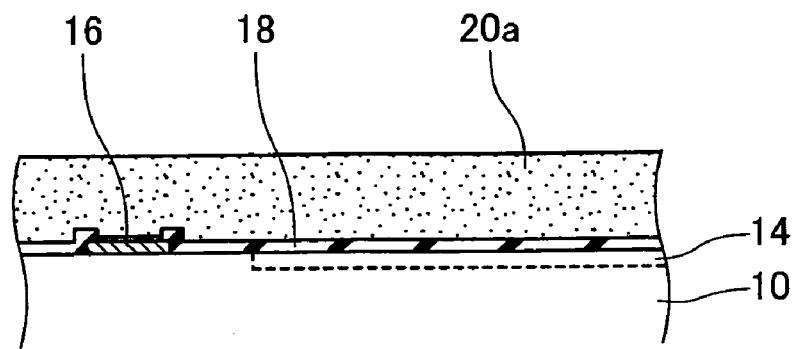
FIG. 3 is a view illustrative of a method of manufacturing a semiconductor device according to one embodiment of the invention.
Figure 4:
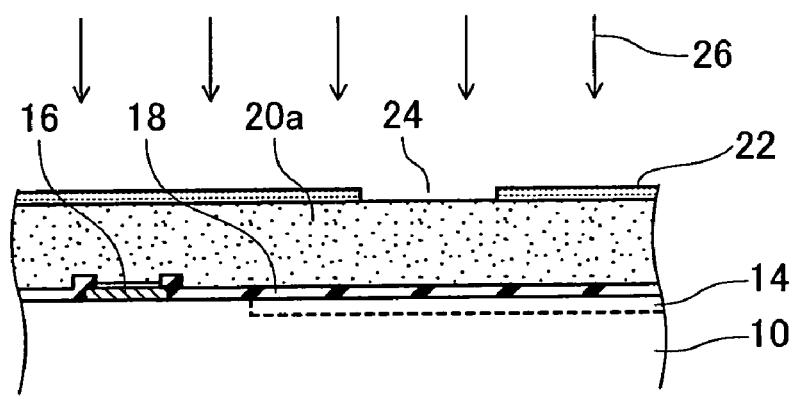
FIG. 4 is a view illustrative of a method of manufacturing a semiconductor device according to one embodiment of the invention.
Figure 5:
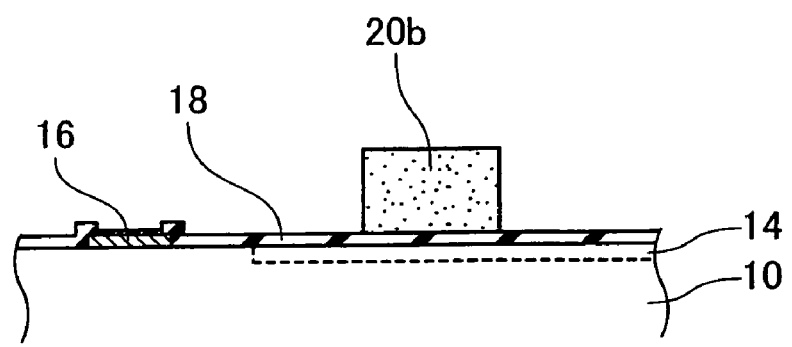
FIG. 5 is a view illustrative of a method of manufacturing a semiconductor device according to one embodiment of the invention.

As shown in FIG. 3, a photosensitive first resin layer 20a is applied to the semiconductor substrate 10 by spin coating or the like. As shown in FIG. 4, a mask 22 having an opening 24 is disposed on the semiconductor substrate 10, and the first resin layer 20a is exposed by applying photo energy 26. When using a negative-tone resin, which is decreased in solubility in a developer in the area in which the photo energy 26 is applied, as the first resin layer 20a, the resin remains only in the area in which the resin is exposed through the opening 24 in the mask 22. On the other hand, when using a positive-tone resin, which is increased in solubility in a developer in the area in which the photo energy 26 is applied, as the first resin layer 20a, the resin remains only in the area in which the resin is covered with the mask 22. A development step is then performed to obtain a first resin layer 20b patterned into a specific shape, as shown in FIG. 5.

As examples of the resin material for the first resin layer 20, elastic resin materials such as a polyimide resin, acrylic resin, phenol resin, epoxy resin, silicone resin, and modified polyimide resin can be given. The material for the first resin layer 20 may be a polyimide, polybenzoxazole, benzocyclobutene, or epoxy which is an aromatic organic compound having a benzene ring and a ring resulting from condensation of a benzene ring, for example.

Figure 6:
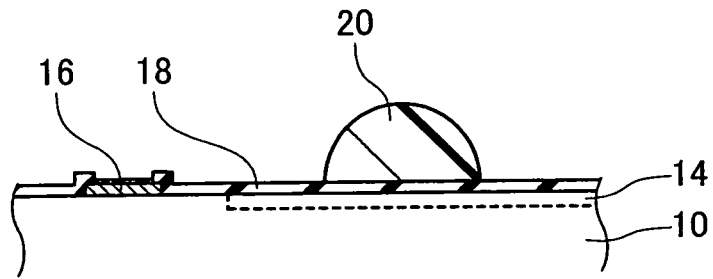
FIG. 6 is a view illustrative of a method of manufacturing a semiconductor device according to one embodiment of the invention.

As shown in FIG. 6, the first resin layer 20b is cured. In more detail, the resin is melted by heating the first resin layer 20b and then caused to undergo cure shrinkage. The curing conditions may be conditions where the first resin layer 20 undergoes complete cure shrinkage or conditions where the cure shrinkage of the first resin layer 20 is at least initiated without being completed. In the latter case, the cure shrinkage of the first resin layer 20 may be completed by another curing step described later. When the patterned first resin layer 20b is formed by a plurality of planes (e.g. when the first resin layer 20b is approximately in the shape of a rectangular parallelepiped), the first resin layer 20 having a curved surface can be formed by the curing step. For example, the first resin layer 20 may be formed to have an approximately semicircular cross section. In this case, the lower portion of the first resin layer 20 is formed to be approximately vertical to the upper surface of the semiconductor substrate 10.

Figure 7:
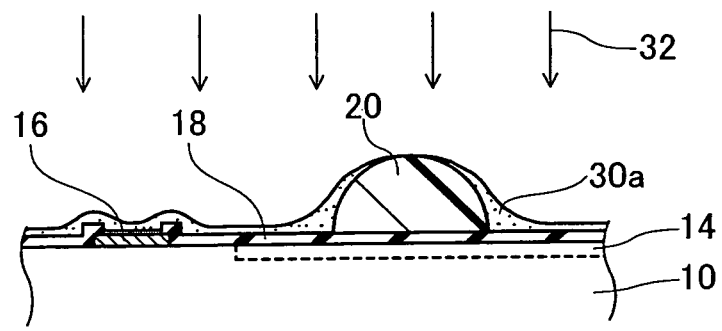
FIG. 7 is a view illustrative of a method of manufacturing a semiconductor device according to one embodiment of the invention.
Figure 8:
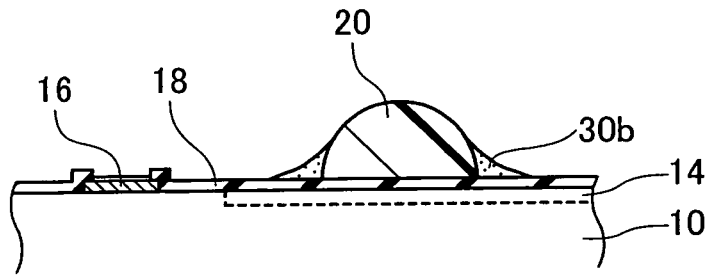
FIG. 8 is a view illustrative of a method of manufacturing a semiconductor device according to one embodiment of the invention.
Figure 9:
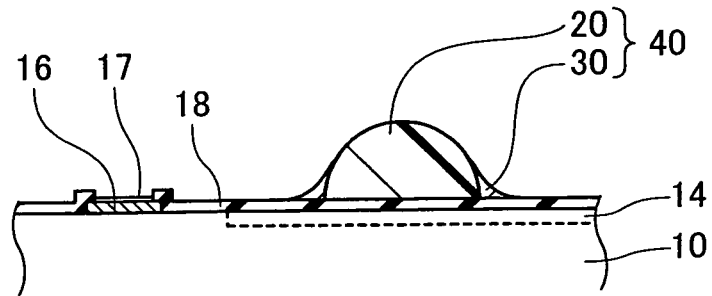
FIG. 9 is a view illustrative of a method of manufacturing a semiconductor device according to one embodiment of the invention.

(3) As shown in FIGS. 7 to 9, a second resin layer 30 is formed.

The second resin layer 30 is formed on at least the lower portion of the first resin layer 20 so that a final resin protrusion 40 slopes more gently than the cured first resin layer 20. It suffices that the second resin layer 30 slope more gently than the first resin layer 20 after final curing. The application form and the application area of the second resin layer 30 before curing may be arbitrarily adjusted correspondingly.

In more detail, a second resin layer 30a is applied to the semiconductor substrate 10 by spin coating or the like, as shown in FIG. 7. The second resin layer 30a is applied to cover the first resin layer 20. For example, the second resin layer 30a may be applied over the entire surface of the semiconductor substrate 10. The second resin layer 30a is then etched (ashing/plasma processing) using $O_2$ plasma 32 or the like. This allows a second resin layer 30b to be formed on at least the lower portion of the first resin layer 20, as shown in FIG. 8. The second resin layer 30b may be formed on only the lower portion of the first resin layer 20, or may be formed to cover the entire first resin layer 20 including the lower portion and the top portion. In either case, the second resin layer 30b is formed to extend from the lower portion of the first resin layer 20 to the passivation film 18 positioned outside the first resin layer 20. The second resin layer 30b may be formed over the entire periphery of the first resin layer 20 when viewed from the top side.

As a modification, the second resin layer 30a may be formed by a droplet discharge method (e.g. inkjet method). This allows the second resin layer 30a to be directly discharged to only the necessary area. In particular, the inkjet method allows ink (resin material) to be efficiently and economically applied at high speed by applying technology which has been put to practical use for inkjet printers.

As the resin material for the second resin layer 30, the resin material described for the first resin layer 20 may be applied. For example, the first and second resin layers 20 and 30 after curing may be the same resins. The resin material for the second resin layer 30 before curing (applied second resin layer 30a) may exhibit high wettability (low viscosity) with the passivation film 18 in comparison with the resin material for the first resin layer 20 before curing (applied first resin layer 20a). This allows the second resin layer 30 to be formed to gently slope from the lower portion of the first resin layer 20 toward the passivation film 18. The wettability of the resin material may be arbitrarily adjusted by adjusting the type of additive and the like.

As shown in FIG. 9, the second resin layer 30b is cured. In more detail, the resin is melted by heating the second resin layer 30b and then caused to undergo cure shrinkage. When the cure shrinkage of the first resin layer 20 has not been completed, the cure shrinkage of the first resin layer 20 can be completed by this step. The resin protrusion 40 can be thus formed by the cured first and second resin layers 20 and 30.

The resin protrusion 40 has an approximately semicircular cross section and is formed to have a gently sloped surface. A slope angle theta (angle (contact angle) formed by the tangent of the sloped surface near the point at which the sloped surface starts and the surface of the passivation film 18) of the resin protrusion 40 is at least smaller than 90° (optimally the slope angle theta approximately equals 0°). The resin protrusion 40 is formed to be curved so that a recess portion is formed inward (obliquely upward). As described above, when the second resin layer 30 is formed over the entire periphery of the first resin layer 20 (see FIG. 11), a gently sloped surface can be formed over the entire periphery of the resin protrusion 40. This allows a conductive layer 50 described later to extend over the resin protrusion 40 in arbitrary directions while ensuring high adhesion.

Figure 10:
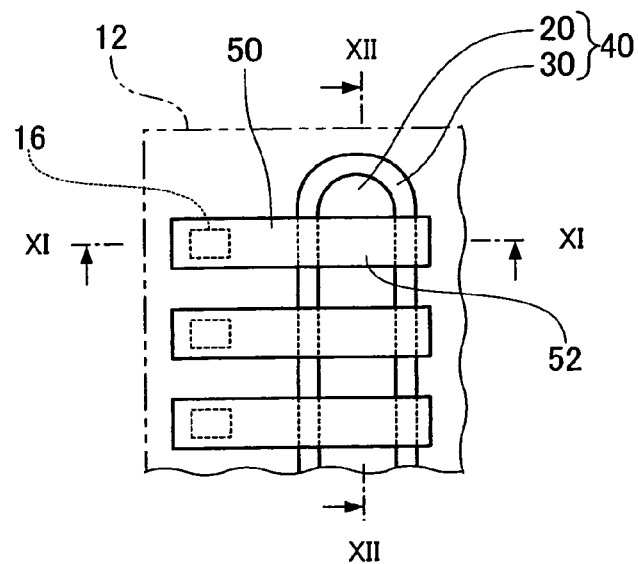
FIG. 10 is a view illustrative of a method of manufacturing a semiconductor device according to one embodiment of the invention.
Figure 11:
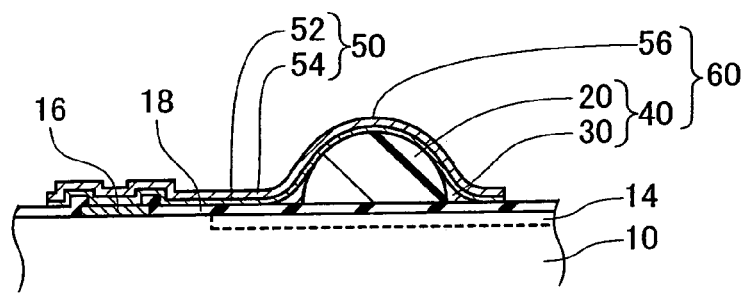
FIG. 11 is a cross-sectional view along the line XI-XI shown in FIG. 10.
Figure 12:
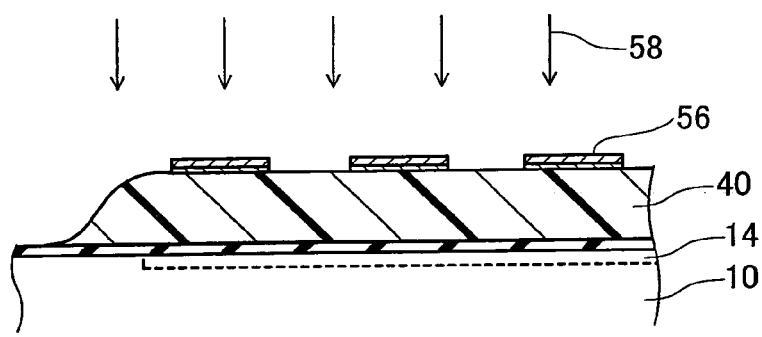
FIG. 12 is a cross-sectional view along the line XII-XII shown in FIG. 10.

(4) As shown in FIGS. 10 to 12, the conductive layer 50 is formed which is electrically connected with the electrode pad 16 and passes over the resin protrusion 40. FIG. 10 is a partial plan view after formation of the conductive layer, FIG. 11 is a cross-sectional view along the line XI-XI shown in FIG. 10, and FIG. 12 is a cross-sectional view along the line XII-XII shown in FIG. 10.

The oxide layer 17 on the electrode pad 16 is removed before forming the conductive layer 50. The oxide layer 17 is an oxide layer formed by spontaneous oxidation or an oxide layer grown during the resin curing step. The oxide layer 17 may be removed by reverse sputtering using Ar gas, for example. When the entire surface of the semiconductor substrate 10 is subjected to reverse sputtering using Ar gas, the surface of the resin protrusion 40 is carbonized. Specifically, a carbide layer or a layer in the preceding stage of the carbide layer (e.g. plasma polymerized layer) is formed on the surface of the resin protrusion 40. Note that this embodiment is particularly advantageous when the carbide layer or the like is formed in this manner.

The conductive layer 50 may be formed by depositing conductive foil by sputtering or deposition and patterning the deposited conductive foil. The conductive layer 50 may be formed by a plurality of layers including a first layer (e.g. TiW layer) 52 as an underlayer and a second layer (e.g. Au layer) 54 formed on the first layer 52, for example. In this case, conductive foil may be formed by the first and second layers 52 and 54, the second layer 54 may be patterned by etching using a resist as a mask, and the first layer 52 may be patterned using the patterned second layer 54 as a mask. The first layer 52 as an underlayer may be utilized as a metal diffusion prevention layer, an adhesion improving layer, or a plating layer. As a modification, the first layer 52 as an underlayer may be formed by sputtering or deposition, and the second layer 54 may be formed on the first layer 52 by electroless plating or electroplating. This allows a thick second layer 54 to be easily formed. Or, the conductive layer 50 may be formed by a single layer (e.g. Au layer). The material for the conductive layer 50 is not limited to the above-mentioned materials. For example, Cu, Ni, Pd, Al, Cr, or the like may also be used.

The conductive layer 50 is an interconnect layer which electrically connects the electrode pad 16 and the resin protrusion 40. The conductive layer 50 is formed to pass over at least the electrode pad 16, the passivation film 18, and the resin protrusion 40. In this embodiment, since the resin protrusion 40 is formed to gently slope, the adhesion of the conductive layer 50 can be increased. Therefore, separation and breakage of the conductive layer 50 can be prevented. In the example shown in FIG. 11, the conductive layer 50 is formed to pass over the resin protrusion 40 and extend over the passivation film 18. In other words, the conductive layer 50 is formed to branch from the resin protrusion 40 in a plurality of directions (e.g. opposite directions) and extend over the passivation film 18. This allows the conductive layer 50 to exhibit further increased adhesion to the underlayer. The conductive layer 50 includes an electrical connection section 56 formed on the resin protrusion 40.

Figure 13:
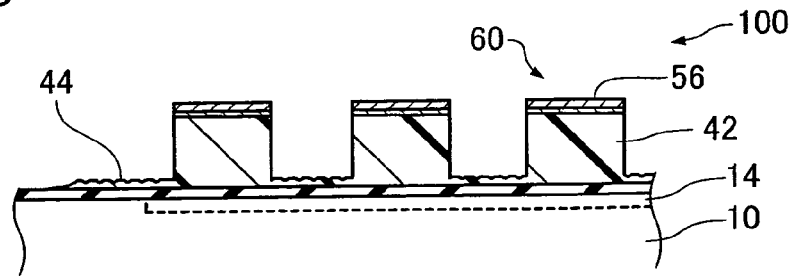
FIG. 13 is a view illustrative of the method of manufacturing a semiconductor device according to one embodiment of the invention.

As shown in FIGS. 12 and 13, after forming the conductive layer 50, the resin protrusion 40 may be partially removed using the conductive layer 50 as a mask. This improves adhesive discharge properties during mounting, for example. For example, when the resin protrusion 40 is linearly formed to have a specific width and the electrical connection sections 56 are arranged at specific intervals in the longitudinal direction of the resin protrusion 40, the portion of the resin protrusion 40 exposed between the adjacent electrical connection sections 56 is removed by etching using an anisotropic etchant (e.g. $O_2$ plasma) 58. In this case, the resin protrusion 40 may be etched so that a resin residue 44 remains between the adjacent electrical connection sections 56 in order to prevent damage to the passivation film 18. According to this embodiment, since the resin protrusion 40 is formed to gently slope, the anisotropic etchant easily approaches the lower portion of the resin protrusion 40. This makes it possible to easily remove the carbide layer or the like formed on the lower portion of the resin protrusion 40 in comparison with a known method. Therefore, migration due to the carbide layer or the like can be prevented, whereby the reliability can be improved.

A semiconductor device 100 including a plurality of resin core bumps 60 can be thus manufactured. The resin core bump 60 is formed on one side (side on which the integrated circuit 14 is formed) of the semiconductor substrate 10, and includes a resin protrusion 42 and the electrical connection section 56 formed on the resin protrusion 42. According to this configuration, since the resin protrusion 42 as the core exhibits elasticity, a stress reducing function and electrical connection reliability during mounting can be increased. A semiconductor device according to this embodiment has a configuration which can be derived from the above-described method of manufacturing a semiconductor device.

Electronic Instrument

Figure 14:
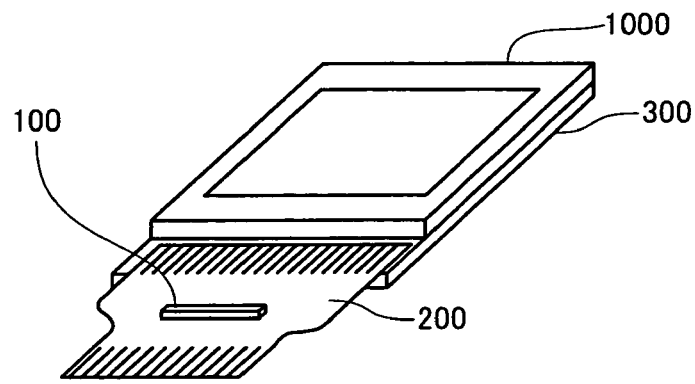
FIG. 14 is a view showing an electronic device according to one embodiment of the invention.
Figure 15:
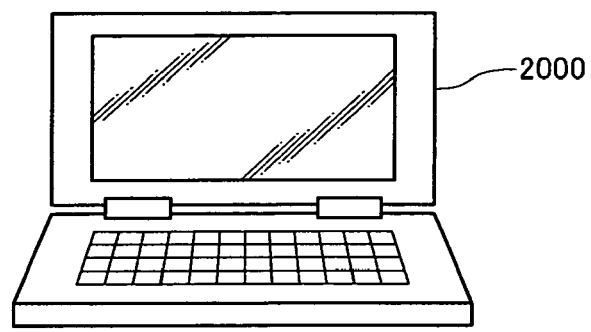
FIG. 15 is a view showing an electronic instrument according to one embodiment of the invention.
Figure 16:
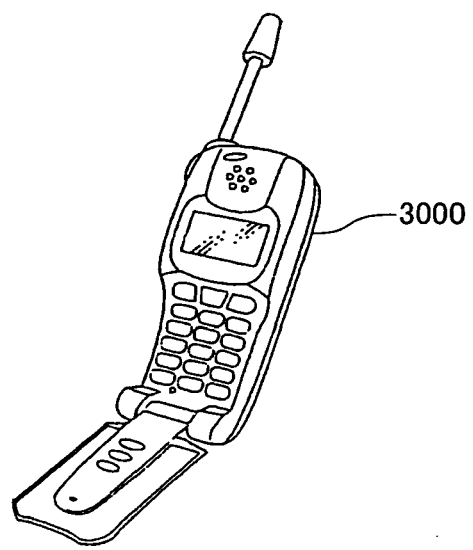
FIG. 16 is a view showing another electronic instrument according to one embodiment of the invention.

FIG. 14 is a view showing an electronic device according to one embodiment of the invention. An electronic device (e.g. display device) 1000 includes the semiconductor device 100. In the example shown in FIG. 14, the electronic device 1000 includes the semiconductor device 100, a first substrate 200 formed by a resin film or the like, and a second substrate 300 formed of glass or the like. The semiconductor device 100 is mounted face-down on the first substrate 200, for example. In more detail, a wiring pattern formed on the first substrate 200 is electrically connected with the resin core bumps 60 of the semiconductor device 100. An insulating adhesive (not shown) (e.g. non-conductive film (NCF) or non-conductive paste (NCP)) is provided between the semiconductor device 100 and the first substrate 200. Or, the first substrate 200 may be omitted, and the semiconductor device 100 may be mounted face-down on the second substrate 300. As examples of the electronic device 1000, a liquid crystal display, a plasma display, an electroluminescent (EL) display, and the like can be given. FIGS. 15 and 16 respectively illustrate a notebook type personal computer and a portable telephone as examples of an electronic instrument according to one embodiment of the invention.

Modification

Figure 17:
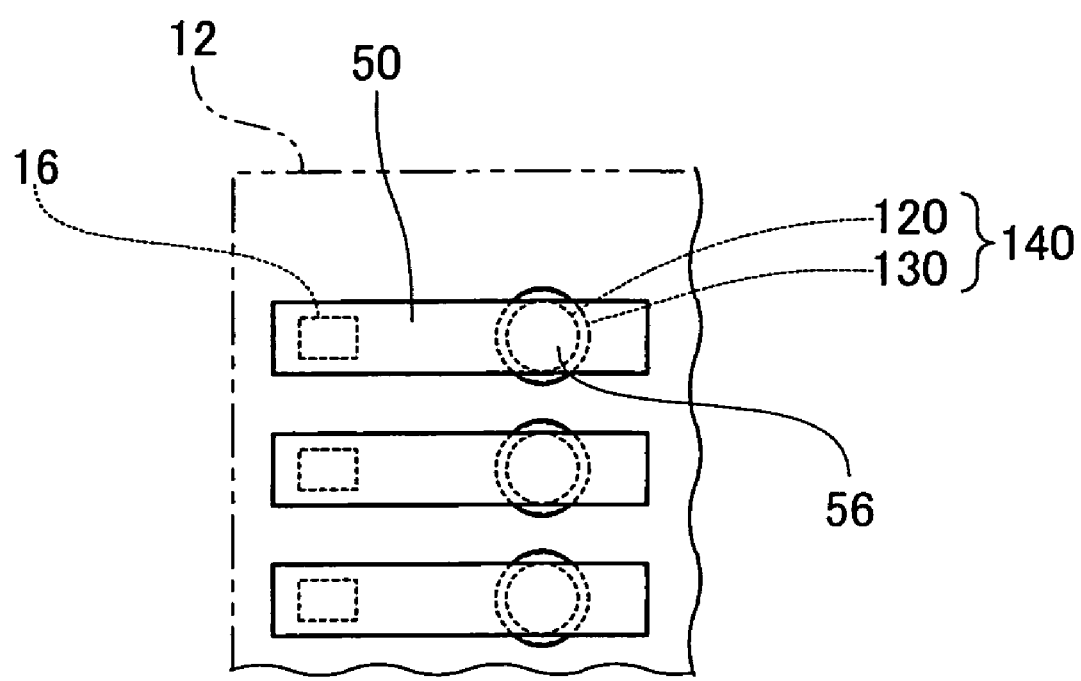
FIG. 17 is a view illustrative of a method of manufacturing a semiconductor device according to a modification of one embodiment of the invention.

FIG. 17 is a view illustrative of a method of manufacturing a semiconductor device according to a modification of one embodiment of the invention. This modification differs from the above-described embodiment as to the form of a resin protrusion 140.

The above description may be applied to the details of the formation steps of first and second resin layers 120 and 130. In this modification, the resin protrusions 140 are formed to be separated from one another so that each of the resin protrusions 140 makes a pair with one of the electrode pads 16 before the formation step of the conductive layer 50. For example, the first resin layer 120 may be patterned into a columnar shape, and may be formed into a semicircular shape by the curing step. The second resin layer 130 may be formed over the entire periphery of the first resin layer 120.

The conductive layer 50 electrically connects one of the electrode pads 16 and one of the resin protrusions 140, for example. In this case, the conductive layer 50 may be formed to cover only part of the resin protrusion 140, or may be formed to cover the entire resin protrusion 140. In the former case, since an external force is released by exposing part of the resin protrusion 140, occurrence of cracks in the electrical connection section 56 (conductive layer 50) during mounting can be prevented.

In this modification, since the resin protrusions 140 are formed to be separated from one another, the step of partially removing the resin protrusion after forming the conductive layer 50 can be omitted, differing from the above-described example.

The above description may be applied to other details of this modification. This modification also exerts the above-described effects.

The invention is not limited to the above-described embodiments, and various modifications can be made. For example, the invention includes various other configurations substantially the same as the configurations described in the embodiments (in function, method and result, or in objective and result, for example). The invention also includes a configuration in which an unsubstantial portion in the described embodiments is replaced. The invention also includes a configuration having the same effects as the configurations described in the embodiments, or a configuration able to achieve the same objective. Further, the invention includes a configuration in which a publicly known technique is added to the configurations in the embodiments.

Although only some embodiments of the invention have been described in detail above, those skilled in the art will readily appreciate that many modifications are possible in the embodiments without departing from the novel teachings and advantages of this invention. Accordingly, all such modifications are intended to be included within the scope of this invention.

What is claimed is:

1. A method of manufacturing a semiconductor device comprising:
   (a) forming a first resin layer above a semiconductor substrate including an electrode pad and a passivation film;
   (b) curing the first resin layer;
   (c) forming a second resin layer on a lower portion of the first resin layer except for a top portion of the first resin layer to expose the top portion from the second resin layer;
   (d) curing the second resin layer to form a resin protrusion which includes the first and second resin layers and slopes more gently than the cured first resin layer; and
   (e) forming a conductive layer over the second resin layer and directly on the top portion of the first resin layer so as to be electrically connected to the electrode pad.

2. The method of manufacturing a semiconductor device as defined in claim 1,
   wherein, in the step (e), an oxide film is removed from a surface of the electrode pad and a surface of the resin protrusion is carbonized by using argon gas before forming the conductive layer, and, after forming the conductive layer, the resin protrusion is partially removed by using the conductive layer as a mask.

3. The method of manufacturing a semiconductor device as defined in claim 1,
   wherein, in the step (c), the second resin layer is formed over an entire periphery at the lower portion of the first resin layer.

4. The method of manufacturing a semiconductor device as defined in claim 1,
   wherein, in the step (c), the second resin layer is formed by applying a resin material for the second resin layer to the semiconductor substrate and the first resin layer and etching the applied resin material on the top portion of the first resin layer.

5. The method of manufacturing a semiconductor device as defined in claim 1,
   wherein, in the step (c), the second resin layer is formed by a droplet discharge method.

6. A method of manufacturing a semiconductor device comprising:
   (a) forming a first resin layer above a semiconductor substrate including an electrode pad and a passivation film;
   (b) curing the first resin layer;
   (c) forming a second resin layer on at least a lower portion of the first resin layer;
   (d) curing the second resin layer to form a resin protrusion which includes the first and second resin layers and slopes more gently than the cured first resin layer; and
   (e) forming a conductive layer which is electrically connected to the electrode pad and passed over the resin protrusion,
   wherein a resin material for the second resin layer before curing exhibits wettability with the passivation film greater than the wettability of a resin material for the first resin layer before curing.

* * * * *